United States Patent
Tang et al.

(10) Patent No.: US 10,251,293 B2
(45) Date of Patent: Apr. 2, 2019

(54) SMART USB MODULES AND METHOD OF MAKING

(71) Applicant: Kingston Digital, Inc., Fountain Valley, CA (US)

(72) Inventors: Choon-Tak Tang, Irvine, CA (US); Ke-Chun Chou, Hsinchu (TW)

(73) Assignee: Kingston Digital, Inc., Fountain Valley, CA (US)

( * ) Notice: Subject to any disclaimer, the term of this patent is extended or adjusted under 35 U.S.C. 154(b) by 11 days.

(21) Appl. No.: 14/244,786

(22) Filed: Apr. 3, 2014

(65) Prior Publication Data

US 2015/0289402 A1    Oct. 8, 2015

(51) Int. Cl.
G06F 1/16  (2006.01)
H05K 5/02  (2006.01)

(52) U.S. Cl.
CPC ......... *H05K 5/0278* (2013.01); *G06F 1/1698* (2013.01)

(58) Field of Classification Search
CPC ...... H05K 5/0278; H05K 1/18; H05K 5/0047; H05K 2201/10159; G06F 1/1698
See application file for complete search history.

(56) References Cited

U.S. PATENT DOCUMENTS

| | | | |
|---|---|---|---|
| 8,085,544 B2 * | 12/2011 | Zhao | H01R 13/447 |
| | | | 235/441 |
| 8,539,258 B2 * | 9/2013 | Kim | H04N 21/43632 |
| | | | 710/13 |
| 2005/0086413 A1 | 4/2005 | Lee et al. | |
| 2005/0109841 A1 * | 5/2005 | Ryan et al. | 235/380 |
| 2006/0026348 A1 * | 2/2006 | Wallace | G06K 19/07732 |
| | | | 711/115 |
| 2006/0149895 A1 | 7/2006 | Pocrass | |
| 2006/0208066 A1 * | 9/2006 | Finn et al. | 235/380 |
| 2007/0032098 A1 * | 2/2007 | Bowles | H01M 10/46 |
| | | | 439/11 |
| 2007/0076387 A1 * | 4/2007 | Ni | H01R 13/502 |
| | | | 361/760 |
| 2008/0052439 A1 | 2/2008 | Young et al. | |
| 2010/0199016 A1 * | 8/2010 | Paulos | H05K 5/0278 |
| | | | 710/313 |
| 2013/0179610 A1 | 7/2013 | Smurthwaite et al. | |

FOREIGN PATENT DOCUMENTS

| | | |
|---|---|---|
| GB | 2482351 | 2/2012 |
| WO | WO2008/143693 | 11/2008 |
| WO | WO 2013147789 A1 * | 10/2013 ......... G06F 13/4291 |

OTHER PUBLICATIONS

"SanDisk Connect Wireless Flash Drive", PCMag.com, http://www.pcmag.com/article2/0,2817,2426986,00.asp, Jan. 13, 2014.
"Combined Search and Examination Report under Sections 17 and 18(3)" for UK Application No. GB1407980.0, dated Oct. 28, 2014.

* cited by examiner

*Primary Examiner* — Sonji N Johnson
(74) *Attorney, Agent, or Firm* — Brundidge & Stanger, P.C.

(57) ABSTRACT

A system and method for data storage are disclosed. In a first aspect, the system comprises a printed circuit board, a central processing unit (CPU) coupled to the printed circuit board, an USB connector coupled to the CPU, and an USB receptacle connector coupled to the CPU. In a second aspect, the system is a smart USB device that includes a smart USB module and a USB drive coupled to the smart USB module.

14 Claims, 6 Drawing Sheets

SMART USB MODULES AND METHOD OF MAKING

FIELD OF THE INVENTION

The present invention relates to memory drives, and more particularly, to smart USB modules and smart USB devices.

BACKGROUND

Memory drives such as USB drives are frequently used for data storage and the transferring of electronic data between computers or devices. Conventionally, USB drives act as a client and are considered "dump" devices that require plugging into a computer or device with an USB port ("host computer") to enable data transfer from the host computer to the USB drives or from the USB drives to the host computer. Therefore, conventional USB drives require a host computer to function and the data cannot be accessed instantly as needed until a host computer is available, for example at home or at the office. Therefore, there is a strong need for a solution that overcomes the aforementioned issues. The present invention addresses such a need.

SUMMARY OF THE INVENTION

A system and method for data storage are disclosed. In a first aspect, the system comprises a printed circuit board, a central processing unit (CPU) coupled to the printed circuit board, an USB connector coupled to the CPU, and an USB receptacle connector coupled to the CPU.

In a second aspect, the system is a smart USB device that includes a smart USB module and a USB drive coupled to the smart USB module.

BRIEF DESCRIPTION OF THE DRAWINGS

The accompanying figures illustrate several embodiments of the invention and, together with the description, serve to explain the principles of the invention. One of ordinary skill in the art readily recognizes that the embodiments illustrated in the figures are merely exemplary, and are not intended to limit the scope of the present invention.

DETAILED DESCRIPTION

The present invention relates to memory drives, and more particularly, to smart USB modules and smart USB devices. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Memory drives such as USB drives are used for data storage and the transferring of data between computers and devices. A method and system in accordance with the present invention provide a smart USB module and a smart USB device that enable the automated, continuous, and instantaneous access and transferring capability to the data stored within the USB device from anywhere and at any time and without the need for connecting the USB device to a host computer for data access and/or data transferring. The smart USB modules and smart USB devices are cost-effective, simple, easy to implement and easily adaptable to existing environments. Additionally, a method in accordance with the present invention provides for an easy conversion of conventional USB drives into smart USB devices.

In one embodiment, the smart USB module converts a client USB drive into a smart USB device. The smart USB modules and devices provide access instantly to stored data without using a computer USB host port and instead by plugging the smart USB device into any USB-power adapter. The smart USB device can be automatically switched to act and function as a smart USB device when it is plugged into any type of USB-power adapter without requiring the usage of a manual push button. The smart USB device can be automatically switched to act and function as a client USB drive or a smart USB device when plugged into any computer USB host port.

In one embodiment, the smart USB module comprises a top housing, a bottom housing, a printed circuit board, an USB connector, an USB receptacle connector, a central processing unit (CPU), a bus coupled to the CPU, a memory/buffer coupled to the bus, a wireless device coupled to the bus or integrated into the CPU. The memory/buffer includes a configuration function which can be accessed through a portable device for configuration as well as wirelessly accessing to the smart USB module and smart USB device. In one embodiment, the wireless access utilizes industry standard IEEE802.11 or Bluetooth.

To describe the features of the present invention in more detail, refer now to the following description in conjunction with the accompanying Figures.

Figure 1:
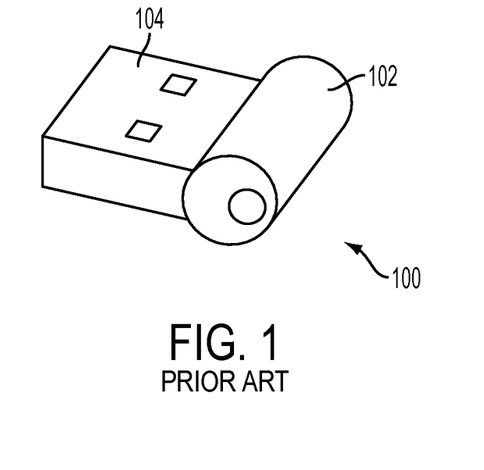
FIG. 1 illustrates prior art of a conventional USB drive.

FIG. 1 illustrates prior art of a conventional USB drive 100. The USB drive 100 includes a base portion 102 coupled to an USB connector 104. The USB drive 100 is used for electronic data storage and for transferring of electronic data between computers/devices. The USB drive 100 acts as a client and is considered a "dump" device since it requires connection to a host computer to transfer the data. The USB drive 100 is required to be plugged into a computer USB host port ("host") to transfer the data from the host to the USB drive 100 or from the USB drive 100 to the host.

Figure 2:
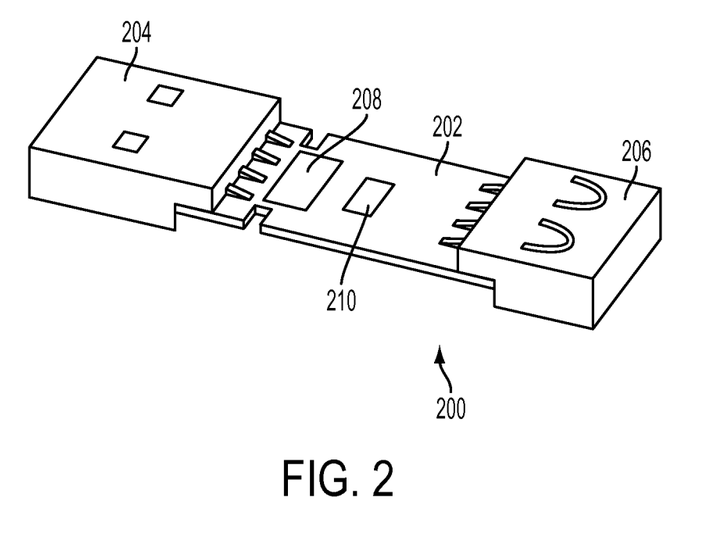
FIG. 2 illustrates a smart USB module in accordance with an embodiment.

FIG. 2 illustrates a smart USB module 200 in accordance with an embodiment. The smart USB module 200 comprises a printed circuit board 202, an USB connector 204, an USB receptacle connector 206, a central processing unit (CPU) 208, and a wireless device 210. The USB receptacle connector 206 enables a client USB drive (e.g. USB drive 100) to be coupled and attached to create a smart USB device. In one embodiment, the smart USB module 200 includes a bus coupled to the CPU 208, a memory/buffer coupled to the bus, and the wireless device 210 coupled to the bus. In another embodiment, the wireless device 210 is integrated into the CPU 208.

The memory/buffer includes a configuration function which can be accessed through a portable device (e.g. smartphone, tablet, etc.) to configure the smart USB module 200 and to wirelessly access any of the smart USB module 200 and a smart USB device. In one embodiment, the configuration function is a mobile software based application ("Mobile App") that is installed and/or downloaded from the Application Store (e.g. Apple App Store) to the portable device. The Mobile App enables the configuration of the wireless network settings (e.g. SSID, wireless channel, security password, etc.). Once the wireless network settings are established between the smart USB module 200 and the portable device, the content from the smart USB device can be accessed wirelessly.

In one embodiment, the wireless device 210 supports any of IEEE802.11 standards, Wi-Fi, and Bluetooth. In one embodiment, the smart USB module 200 does not include a wireless device but is activated to communicate wirelessly when a wireless-enabled USB drive is connected via the USB receptacle connector 206 to create a smart USB device. Therefore, in this embodiment, the wireless capability of created smart USB device is enabled by the USB drive.

Figure 3:
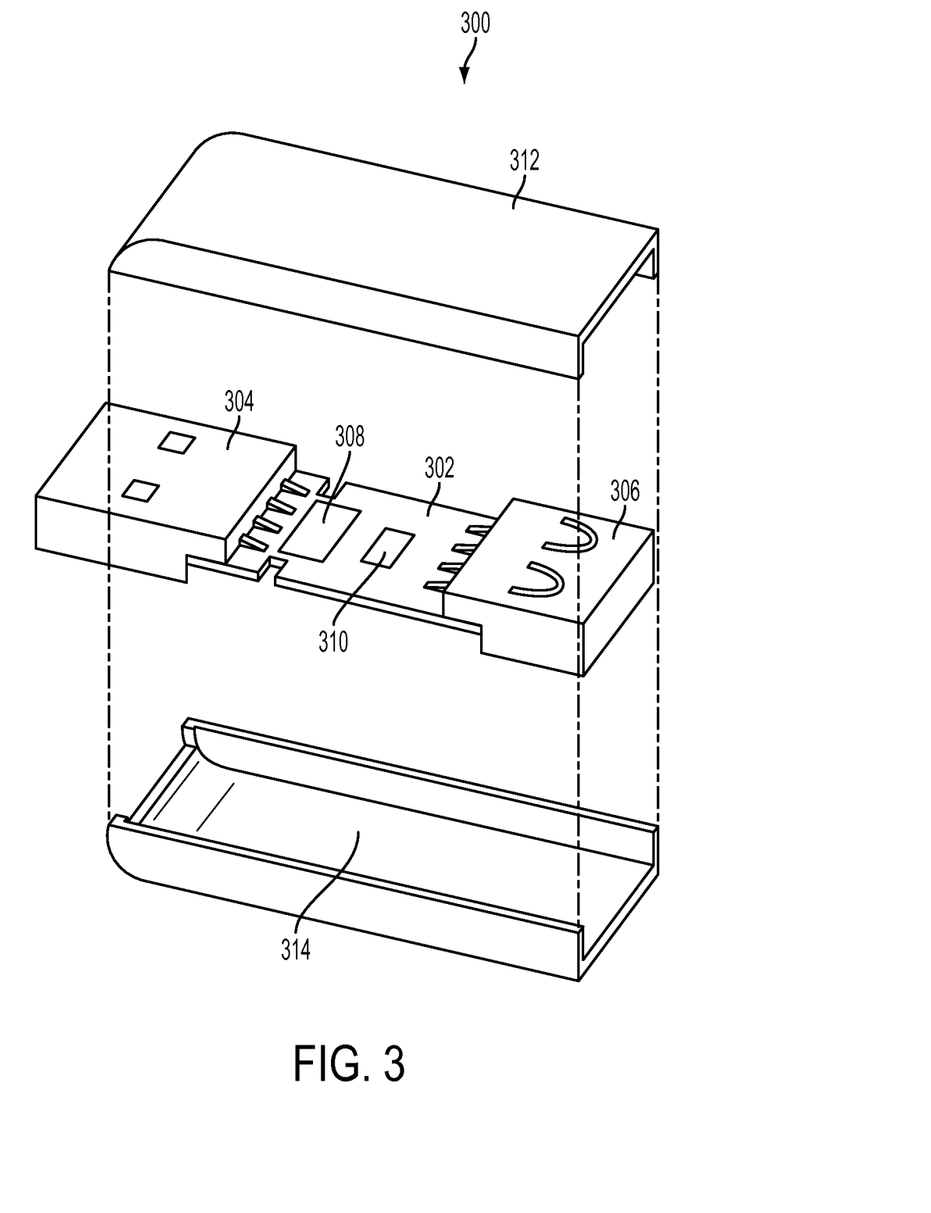
FIG. 3 illustrates an exploded view of a smart USB module with housing in accordance with an embodiment.

FIG. 3 illustrates an exploded view of a smart USB module 300 with housings in accordance with an embodiment. The smart USB module 300 comprises similar components to the smart USB module 200 of FIG. 2 including a printed circuit board 302, an USB connector 304, an USB receptacle connector 306, a central processing unit (CPU) 308, and a wireless device 310. In addition, the smart USB module 300 includes a top housing 312 and a bottom housing 314 that house the components 302-310. In one embodiment, the smart USB module 300 includes a bus coupled to the CPU 308, a memory/buffer coupled to the bus, and the wireless device 310 coupled to the bus. In another embodiment, the wireless device 310 is integrated into the CPU 308. The memory/buffer includes a configuration function which can be accessed through a portable device (e.g. smartphone, tablet, etc.) to configure the smart USB module 300 and to wirelessly access any of the smart USB module 300 and a smart USB device. In one embodiment, the wireless device 310 supports any of IEEE802.11 standards, Wi-Fi, and Bluetooth.

Figure 4:
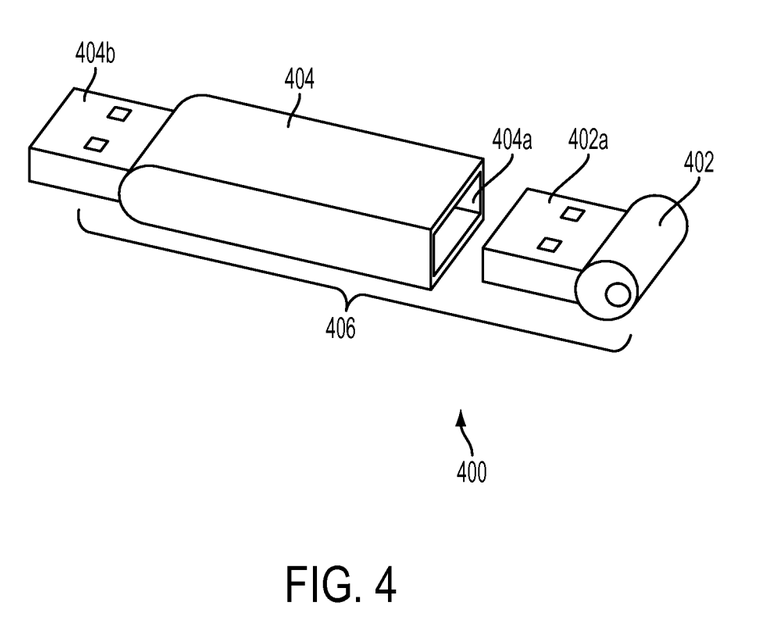
FIG. 4 illustrates a diagram of converting an USB drive to a smart USB device using a smart USB module in accordance with an embodiment.

A client USB drive (e.g. USB drive 100) is coupled to the USB receptacle connector of the smart USB module to provide a smart USB device. FIG. 4 illustrates a diagram 400 of converting an USB drive to a smart USB device using a smart USB module in accordance with an embodiment. The diagram 400 depicts an USB drive 402 coupling to a smart USB module 404 to provide a smart USB device 406. The USB drive 402 is coupled to the smart USB module 404 via an USB connector 402a of the USB drive 402 that is inserted or plugged directly into an USB receptacle connector 404a of the smart USB module 404. The smart USB module 404 (or the smart USB device 406 once the USB drive 402 is connected) includes an USB connector 404b that is coupled or plugged directly to any of an USB receptacle connector of an USB-power adapter, a computer USB host port, and an USB port of another device.

Figure 5:
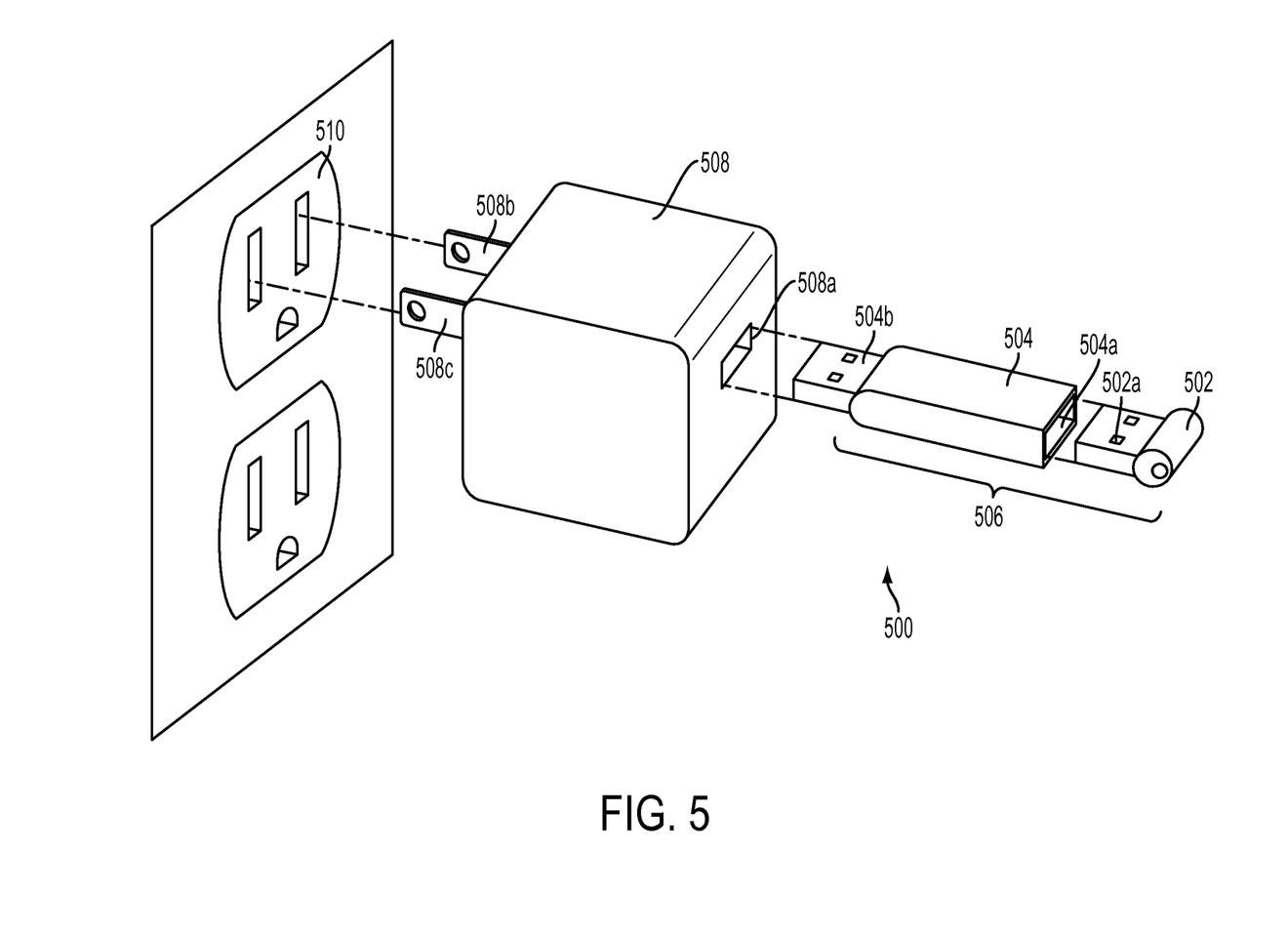
FIG. 5 illustrates a diagram of wirelessly and remotely accessing a smart USB device when plugged into an USB-power adapter in accordance with an embodiment.

FIG. 5 illustrates a diagram 500 of wirelessly and remotely accessing a smart USB device when plugged into an USB-power adapter in accordance with an embodiment. The diagram 500 includes an USB drive 502 coupling to a smart USB module 504 to provide a smart USB device 506. The USB drive 502 is coupled to the smart USB module 504 via an USB connector 502a of the USB drive 502 that is inserted or plugged directly into an USB receptacle connector 504a of the smart USB module 504. The smart USB module 504 (or the smart USB device 506 once the USB drive is connected) includes an USB connector 504b that is coupled or plugged directly to any of an USB receptacle connector 508a of an USB-power adapter 508, a computer USB host port, and an USB port of another device.

In one embodiment, the USB-power adapter 508 includes two plug-pins 508b-c that are plugged into a power outlet 510. In another embodiment, the USB-power adapter 508 does not include two plug-pins and is not plugged into a power outlet 510 typically found in the wall. Instead, the USB-power adapter 508 is a different type of powering adapter including but not limited to a stand-alone battery-powered adapter and a solar-powered adapter that does not require plugging into the power outlet 510.

Once the smart USB device 506 is powered up by being plugged into an USB-power adapter that has been plugged into any of the power outlet 510 and another power source, the smart USB device 506 sends out a signal to make itself ready for access through at least one of a plurality of portable devices. The smart USB device 506 is accessed by at least one of the plurality of portable devices after a setup process that establishes a wireless connection between the smart USB device 506 and the at least one of the plurality of portable devices. In another embodiment, the smart USB module 504 further comprises a rechargeable battery to power the smart USB device 506 without the usage of the USB-power adapter 508.

In one embodiment, the setup process establishes a wireless connection via any of IEEE802.11, Wi-Fi, mobile broadband, and Bluetooth. In one embodiment, the plurality of portable devices access, transfer, download, upload, and alter the data from the smart USB device 506 via the established wireless connection and then transfer or communicate the data to a cloud-based network (e.g. public cloud, private cloud, etc.) via another wireless connection.

Figure 6:
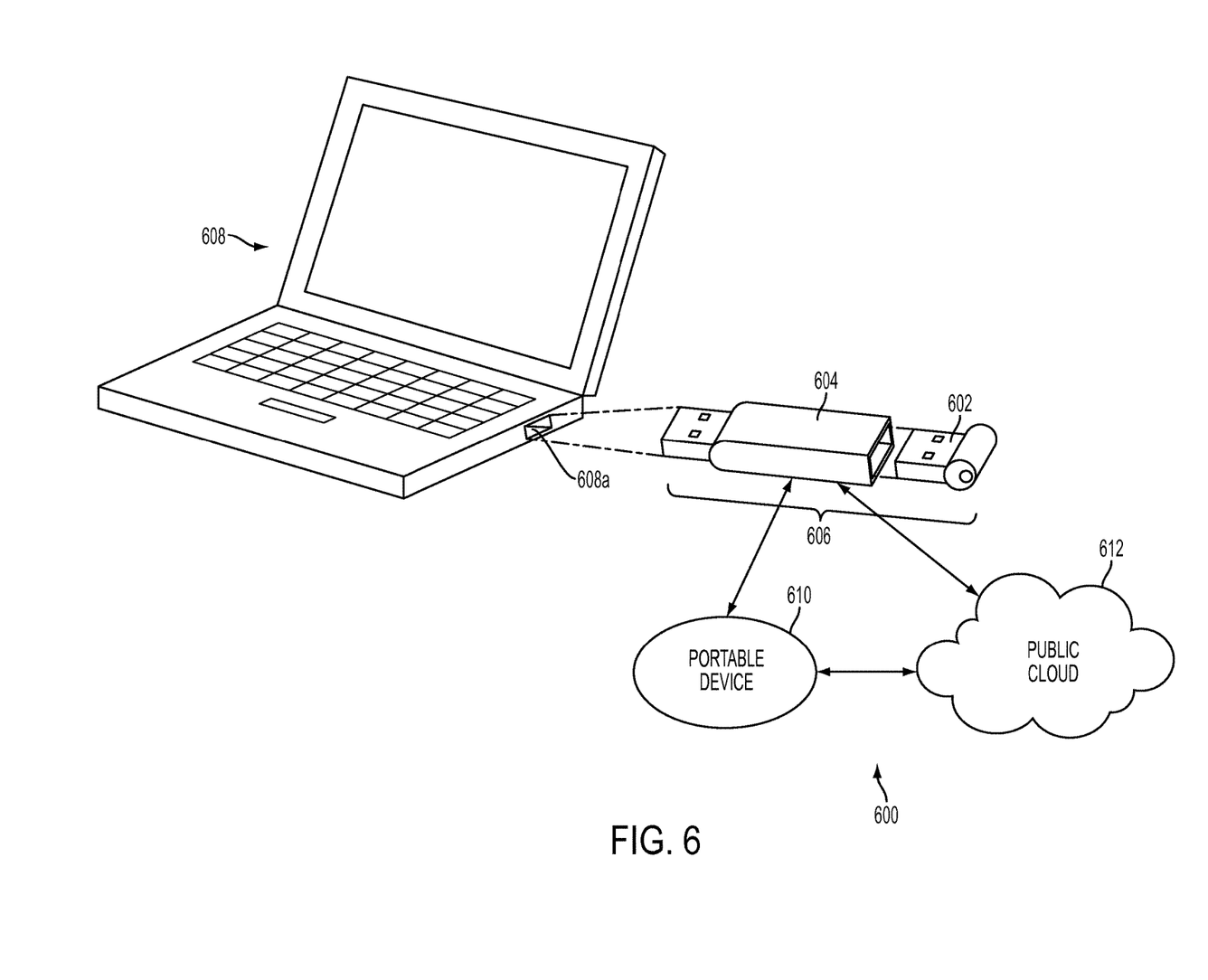
FIG. 6 illustrates a diagram of automatically switching a smart USB device between a plurality of functionality configurations in accordance with an embodiment.

FIG. 6 illustrates a diagram 600 of automatically switching a smart USB device between a plurality of functionality configurations in accordance with an embodiment. The diagram 600 includes an USB drive 602 coupling to a smart USB module 604 to provide a smart USB device 606. By default, the smart USB device 606 is automatically switched to perform the functionality of an USB drive 602 when plugged into an USB host port 608a of a computing device 608. In this first functionality configuration, data transfer between the computing device 608 and the USB drive 602 is enabled via non-wireless communication.

When the smart USB device 606 is wirelessly connected to a portable device 610 (e.g. smartphone, tablet, etc.) via a setup and configuration process, the smart USB device 606 is automatically switched to a second functionality configuration that performs the functionality of the smart USB device 606 and enables wireless transmission and communication of data between the smart USB device 606 and the portable device 610.

In one embodiment, the portable device 610 is in communication with (or connected to) a public cloud 612 thereby enabling data stored on the smart USB device 606 to be wirelessly accessed by the portable device 610 and then transferred and/or communicated to the public cloud 612 for any of storing, viewing, and analyzing. In one embodiment, the smart USB device 606 is directly connected to the public cloud 612 via a setup and configuration process thereby allowing the portable device 610 to access, transfer, download, or upload data to the public cloud 612 via the smart USB device 606, or to access, transfer, download, or upload data stored to the smart USB device

606. In another embodiment, the public cloud 612 is a private cloud computing environment.

When the smart USB device 606 is wirelessly connected to the portable device 610 (and potentially connected to the public cloud 612 via any of a direct connection and a connection established by the portable device 610), data stored on the smart USB device 606 can be accessed, transferred, downloaded, and/or uploaded by any of the portable device 610 and the public cloud 612, and data stored on any of the portable device 610 and the public cloud 612 can be uploaded to the smart USB device 606.

In one embodiment, the computing device 608 is also portable but the connection with the smart USB device 606 is direct (e.g. the smart USB device 606 is plugged directly into an USB host port 608a of the computing device 608) and therefore not a wireless connection. Therefore, even if the computing device 608 is portable, when the smart USB device 606 is plugged directly into the computing device 608, the smart USB device 606 is automatically switched into the first functionality configuration. In another embodiment, the smart USB device 606 is wirelessly connected with a non-portable device (e.g. mainframe of servers) and the smart USB device 606 is automatically switched into the second functionality configuration.

In one embodiment, when the smart USB device 606 is connected (e.g. directly, wirelessly, via other means) to any of a computing device 608 and a portable device 610, a prompt is generated to enable the manual switching of the smart USB device 606 between configurations that default USB drive 602 functionality, smart USB device 606 functionality, and any other functionality configuration.

In one embodiment, a system or smart USB module for data storage comprises a printed circuit board, a central processing unit (CPU) coupled to the printed circuit board, an USB connector coupled to the CPU, and an USB receptacle connector coupled to the CPU. In one embodiment, the USB connector is on one end of the system and the USB receptacle connector is on the other end of the system and in another embodiment, the USB connector and USB receptacle connector are on the same sides or configured in another configuration. The USB connector connects to any of a computing device, a portable device, and an USB-power adapter that include USB receptacle connectors. The USB receptacle connector connects to any of a USB drive and another device that includes USB connectors. When the USB receptacle connector of the system receives an USB drive, a smart USB device is created/provided that can automatically switch between configurations and communicate with various devices.

In one embodiment, the system further comprises a bus coupled to the CPU, a memory/buffer device coupled to the bus, and a wireless device coupled to the CPU via the bus (or via another configuration such as being directly integrated into the CPU). The wireless device utilizes a plurality of wireless standards including but not limited to IEEE802.11, Wi-Fi, mobile broadband, and Bluetooth to establish a wireless connection between the system and at least one portable device. The memory device includes a configuration function to enable at least one portable device to automatically, remotely, and wirelessly access data stored within the memory.

In one embodiment, the system further comprises a top housing and a bottom housing coupled to the top housing, wherein the printed circuit board, the CPU, the USB connector, and the USB receptacle connector are housed between the top and the bottom housings. In one embodiment, the system is powered by connecting the USB connector of the smart USB module component of the smart USB device to a USB-power adapter that is then plugged into a power outlet. In another embodiment, the system is powered by a plurality of powering mechanisms including but not limited to an internal rechargeable battery coupled to the CPU and a solar charging battery coupled to the external housing of the device and the CPU.

Once the smart USB device is powered, it automatically connects with any of a portable device and a cloud-based network without the usage of a manual push button. The smart USB device could include a list of trusted wireless networks with previously stored login/passwords as part of the setup process that wirelessly connects the smart USB device to the portable device. In one embodiment, when the smart USB device is directly connected to a host computer, it automatically configures itself to function like a conventional USB drive and when the smart USB device is wirelessly connected to a portable device via a setup process, it automatically configures itself to function like a smart USB device.

In one embodiment, the setup process is automatic because the smart USB device is connecting to previously connected and trusted portable devices. In another embodiment, the setup process prompts a user of nearby portable devices that the portable devices can be connected wirelessly before automatically connecting to the portable devices.

In one embodiment, a method for providing a smart USB device comprises providing a smart USB module that includes an USB connector and an USB, providing an USB drive, and coupling the USB drive to the smart USB module thereby providing the smart USB device that can serve as both a conventional USB drive and also as a wireless connectable smart USB device. In this embodiment, the method further includes connecting the smart USB device with any of a host computer device, a portable device, and a cloud-based device to enable the transfer, download, upload, and/or sharing of data that is stored on the smart USB device.

As above described, a method and system in accordance with the present invention provide a smart USB module and a smart USB device that does not require a rechargeable battery and that enables a conventional USB drive to be converted into a device that can be wirelessly accessed by portable devices and connected cloud-based networks. By connecting a conventional USB drive to a smart USB module, a smart USB device is provided that can automatically switch between various configurations depending on the connection type between the smart USB device and another device (e.g. computing device, portable device, etc.) thereby enabling wireless communication and access to the data stored on the smart USB device and eliminating the need to connect a conventional USB drive directly to a computing device to gain access to the data.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:
1. A USB module, comprising:
   a printed circuit board;
   a central processing unit (CPU) coupled to the printed circuit board;

a wireless device coupled to the CPU, via a bus;
a memory buffer coupled to the bus;
a USB connector coupled to the CPU; and
a USB receptacle connector coupled to the CPU, the USB receptacle connector coupling with a client USB drive to form a smart USB device that functions as both a client USB drive and a smart USB device,
   wherein the wireless device establishes a wireless connection between the smart USB device and a portable device,
   wherein the smart USB device functions as a smart USB device as the wireless device utilizes any of IEEE802.11, Wi-Fi, mobile broadband, and Bluetooth to establish the wireless connection between the smart USB device and the portable device, and
   wherein the memory buffer is accessible to the portable device that is wirelessly connected to the smart USB device to access data stored on the memory buffer.

2. The USB module of claim 1, wherein the USB connector is on one end of the USB module and the USB receptacle connector is on the other end of the USB module.

3. The USB module of claim 1, wherein the USB connector connects to any of a computing device, the portable device, and a USB-power adapter.

4. The USB module of claim 1, wherein the USB receptacle connector connects to a USB connector of the client USB drive.

5. The USB module of claim 1, wherein the wireless device is integrated into the CPU.

6. The USB module of claim 1, further comprising:
a top housing; and
a bottom housing coupled to the top housing, wherein the printed circuit board, the CPU, the USB connector, and the USB receptacle connector are housed between the top and the bottom housings.

7. A smart USB device for data storage, the smart USB device comprising:
a smart USB module, wherein the smart USB module includes:
   a printed circuit board,
   a central processing unit (CPU) coupled to the printed circuit board,
   a USB connector coupled to the CPU, via a bus,
   a wireless device coupled to the CPU, via the bus,
   a memory buffer coupled to the CPU, via the bus, and
   a USB receptacle connector coupled to the CPU; and
a client USB drive coupled to the smart USB module via the USB receptacle connector to form the smart USB device that functions as both a client USB drive and a smart USB device,
   wherein the wireless device establishes a wireless connection between the smart USB device and a portable device,
   wherein the smart USB device functions as a smart USB device as the wireless device utilizes any of IEEE802.11, Wi-Fi, mobile broadband, and Bluetooth to establish the wireless connection between the smart USB device and the portable device, and
   wherein the memory buffer is accessible to the portable device that is wirelessly connected to the smart USB device to access data stored on the memory buffer.

8. The smart USB device of claim 7, wherein the USB connector is on one end of the smart USB module and the USB receptacle connector is on the other end of the smart USB module.

9. The smart USB device of claim 8, wherein the USB connector is coupled to a USB-power adapter to power the smart USB device.

10. The smart USB device of claim 7, wherein the USB connector connects to any of a computing device, the portable device, and an USB-power adapter.

11. The smart USB device of claim 7, wherein the smart USB module further comprises:
a top housing; and
a bottom housing coupled to the top housing, wherein the printed circuit board, the CPU, the USB connector, and the USB receptacle connector are housed between the top and the bottom housings.

12. The smart USB device of claim 7, wherein the smart USB module further comprises:
a rechargeable battery coupled to the CPU to power the smart USB device.

13. The smart USB device of claim 7, wherein once the smart USB device is powered, it automatically connects with any of a portable device and a cloud-based network without the usage of a manual push button.

14. The smart USB device of claim 7, wherein the smart USB device includes a first configuration when connected non-wirelessly to a device, and includes a second configuration when connected wirelessly to the device.

* * * * *